US009160351B2

(12) United States Patent
Chen et al.

(10) Patent No.: US 9,160,351 B2
(45) Date of Patent: Oct. 13, 2015

(54) PHASE-LOCKED LOOP CIRCUIT

(71) Applicant: TAIWAN SEMICONDUCTOR MANUFACTURING CO., LTD., Hsinchu (TW)

(72) Inventors: Huan-Neng Chen, Taichung (TW); Kuang-Kai Yen, Kaohsiung (TW); Feng-Wei Kuo, Hsinchu County (TW); Hsien-Yuan Liao, Hsinchu (TW); Tsung-Hsiung Lee, New Taipei (TW); Chewn-Pu Jou, Hsinchu (TW); Robert Bogdan Staszewski, Delft (NL)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/320,168

(22) Filed: Jun. 30, 2014

(65) Prior Publication Data

US 2015/0116018 A1    Apr. 30, 2015

Related U.S. Application Data

(63) Continuation-in-part of application No. 14/062,738, filed on Oct. 24, 2013, now Pat. No. 8,816,735.

(51) Int. Cl.
*H03L 7/06* (2006.01)
*H03L 7/091* (2006.01)
*H03L 7/093* (2006.01)
(Continued)

(52) U.S. Cl.
CPC ............... *H03L 7/091* (2013.01); *H03L 7/085* (2013.01); *H03L 7/093* (2013.01); *H03L 7/0991* (2013.01); *H03L 2207/50* (2013.01)

(58) Field of Classification Search
USPC .................................. 327/147–149, 156–159
See application file for complete search history.

(56) References Cited

U.S. PATENT DOCUMENTS

| 7,183,860 B2 * | 2/2007 | Staszewski et al. ............ 331/1 A |
| 7,801,262 B2 * | 9/2010 | Wallberg et al. .............. 375/376 |
| 8,373,472 B2 * | 2/2013 | Thaller et al. .................. 327/158 |

(Continued)

OTHER PUBLICATIONS

V. Ramakrishnan et al., "A Wide-Range, High-Resolution, Compact, CMOS Time to Digital Converter," Proceedings of the 19th International Conference on VLSI Design (VLSID'06), 6 pages.

(Continued)

*Primary Examiner* — Adam Houston
(74) *Attorney, Agent, or Firm* — McDermott Will & Emery LLP

(57) ABSTRACT

A phase-locked loop circuit, a phase converter module thereof and a phase-locked controlling method are disclosed herein. The phase converter module is suitable for a phase-locked loop circuit including a digitally-controlled oscillator (DCO) for generating an oscillator output signal and a divider for converting the oscillator output signal into N-phased oscillator output signals. The phase converter module includes a period extender, a phase finder and a time-to-digital converter. The period extender is configured for extending the N-phased oscillator output signals into M*N-phased oscillator output signals corresponding to M oscillation period of the digitally-controlled oscillator. The phase finder is configured for sampling the oscillator output signal with the M*N-phased oscillator output signals to calculate an estimated value of the fractional phase part. The time-to-digital converter is configured to calculate a precise value of the fractional phase part within one sub-period.

20 Claims, 11 Drawing Sheets

(51) Int. Cl.
*H03L 7/099* (2006.01)
*H03L 7/085* (2006.01)

(56) References Cited

U.S. PATENT DOCUMENTS

| | | | | |
|---|---|---|---|---|
| 8,432,199 | B2* | 4/2013 | Lee et al. | 327/156 |
| 8,508,266 | B2* | 8/2013 | Frantzeskakis et al. | 327/156 |
| 8,593,189 | B1* | 11/2013 | Yen et al. | 327/156 |
| 2009/0052508 | A1* | 2/2009 | Takahashi | 375/219 |
| 2011/0148490 | A1* | 6/2011 | Lee et al. | 327/159 |
| 2011/0227621 | A1* | 9/2011 | Ridgers | 327/159 |
| 2012/0161832 | A1* | 6/2012 | Lee et al. | 327/156 |
| 2012/0319749 | A1* | 12/2012 | Thaller et al. | 327/158 |
| 2013/0002317 | A1* | 1/2013 | Frantzeskakis et al. | 327/156 |
| 2013/0187688 | A1* | 7/2013 | Wang et al. | 327/156 |
| 2014/0021991 | A1* | 1/2014 | Frantzeskakis et al. | 327/159 |
| 2014/0021992 | A1* | 1/2014 | Frantzeskakis et al. | 327/159 |
| 2015/0116018 | A1* | 4/2015 | Chen et al. | 327/159 |

OTHER PUBLICATIONS

J. R. Hu et al., "A 1.56GHz Wide-Tuning All Digital FBAR-Based PLL in 0.13 μm CMOS," IEEE 2010, 4 pages.

M. Lee et al., "A Low Noise, wideband Digital Phase-locked Loop based on a New Time-to-Digital Converter with Subpicosecond Resolution," 2008 Symposium on VLSI Circuits Digest of Technical Papers, pp. 112-113.

\* cited by examiner

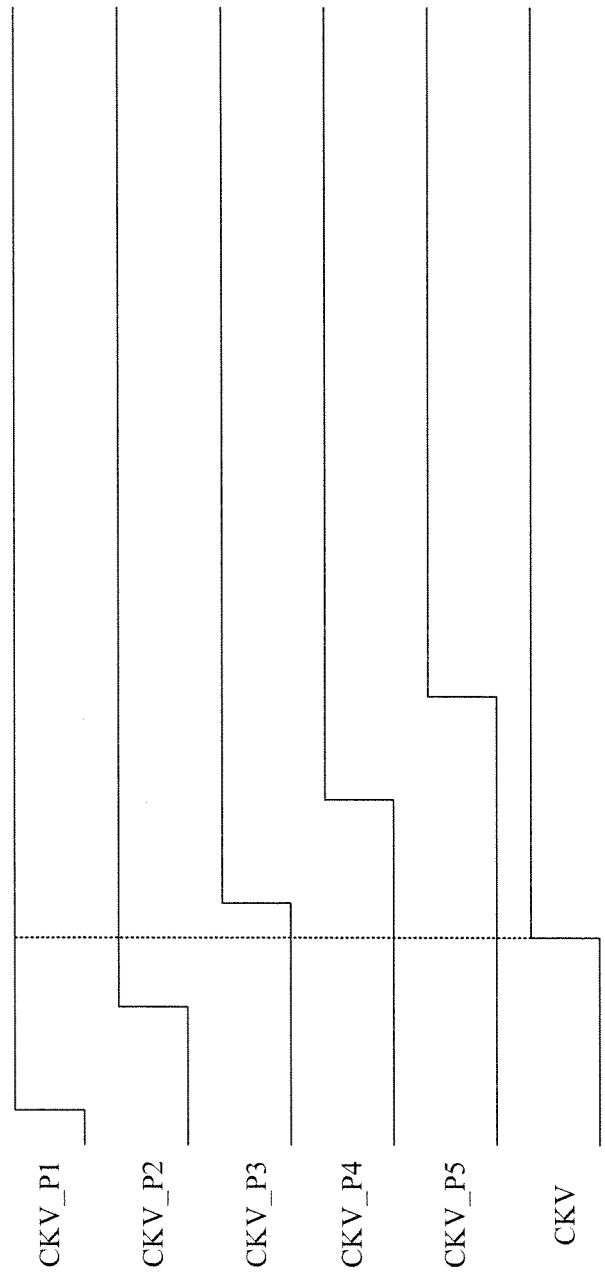

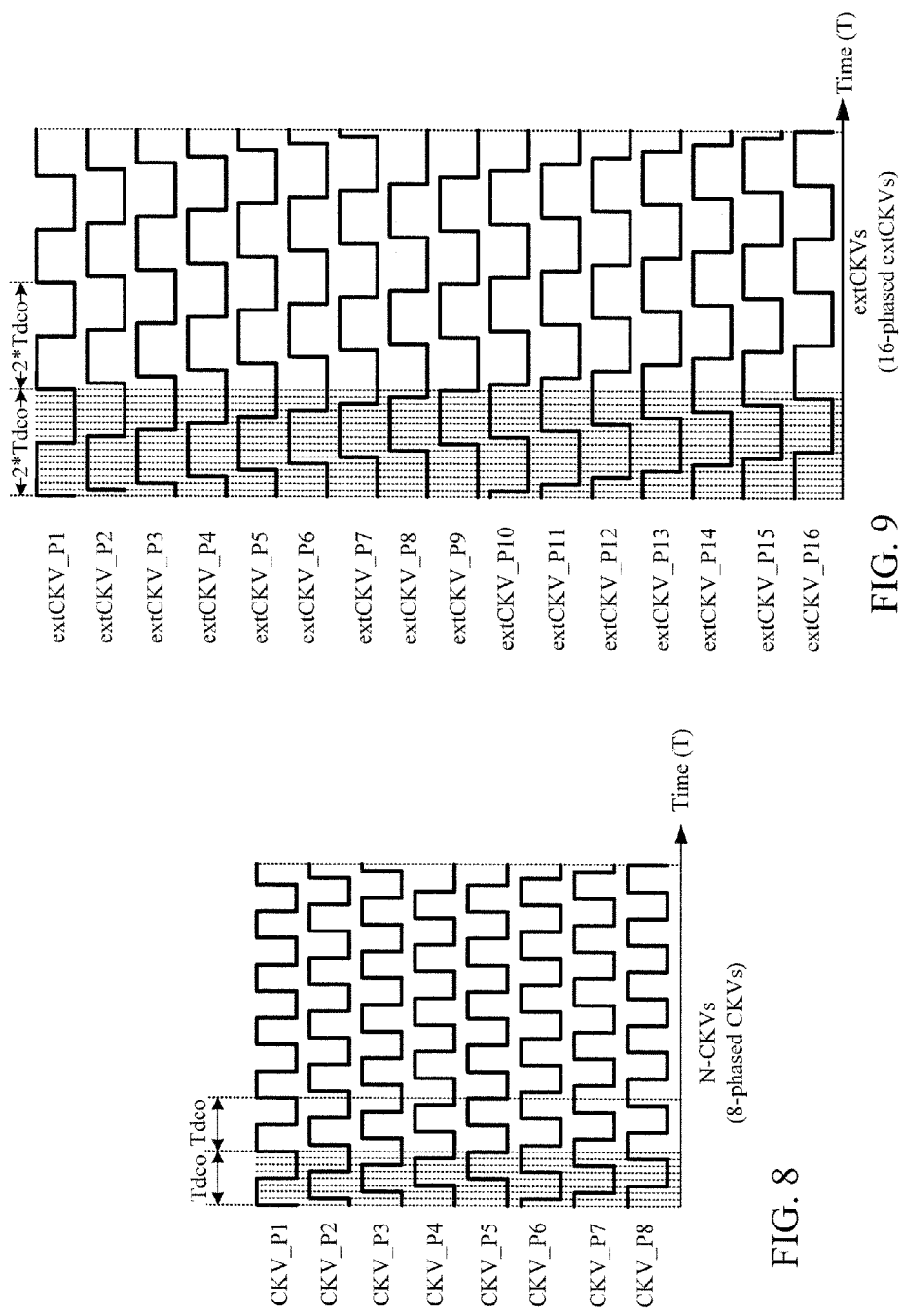

PHASE-LOCKED LOOP CIRCUIT

PRIORITY CLAIM AND CROSS-REFERENCE

This application is a continuation-in-part application of U.S. application Ser. No. 14/062,738, filed Oct. 24, 2013, and the full disclosures of which are incorporated herein by reference.

BACKGROUND

A phase-locked loop (PLL) is an electronic control system that generates an oscillating signal having a fixed phase relationship (e.g., synchronized or having a fixed gap) with a reference signal. A phase-locked loop circuit automatically raises or decreases a frequency of a controlled oscillator until the frequency matches the reference signal in both frequency and phase. An all digital PLL (ADPLL) is a digital system implemented with digital logics. An ADPLL circuit may include a time-to-digital converter (TDC). The TDC is configured for sampling the oscillation signal at a predetermined resolution, and feeding the sampled signal back to the phase detector, so as to raise or lower the frequency of input signals of the ADPLL circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a schematic diagram illustrating an operational example of the phase finder according to embodiments of the disclosure;

FIG. 8 is a schematic diagram illustrating the 8-phased oscillator output signals according to the embodiment;

FIG. 9 is a schematic diagram illustrating the extended 16-phased oscillator output signals generated by the period extender according to the embodiment.

DETAILED DESCRIPTION

Figure 1:
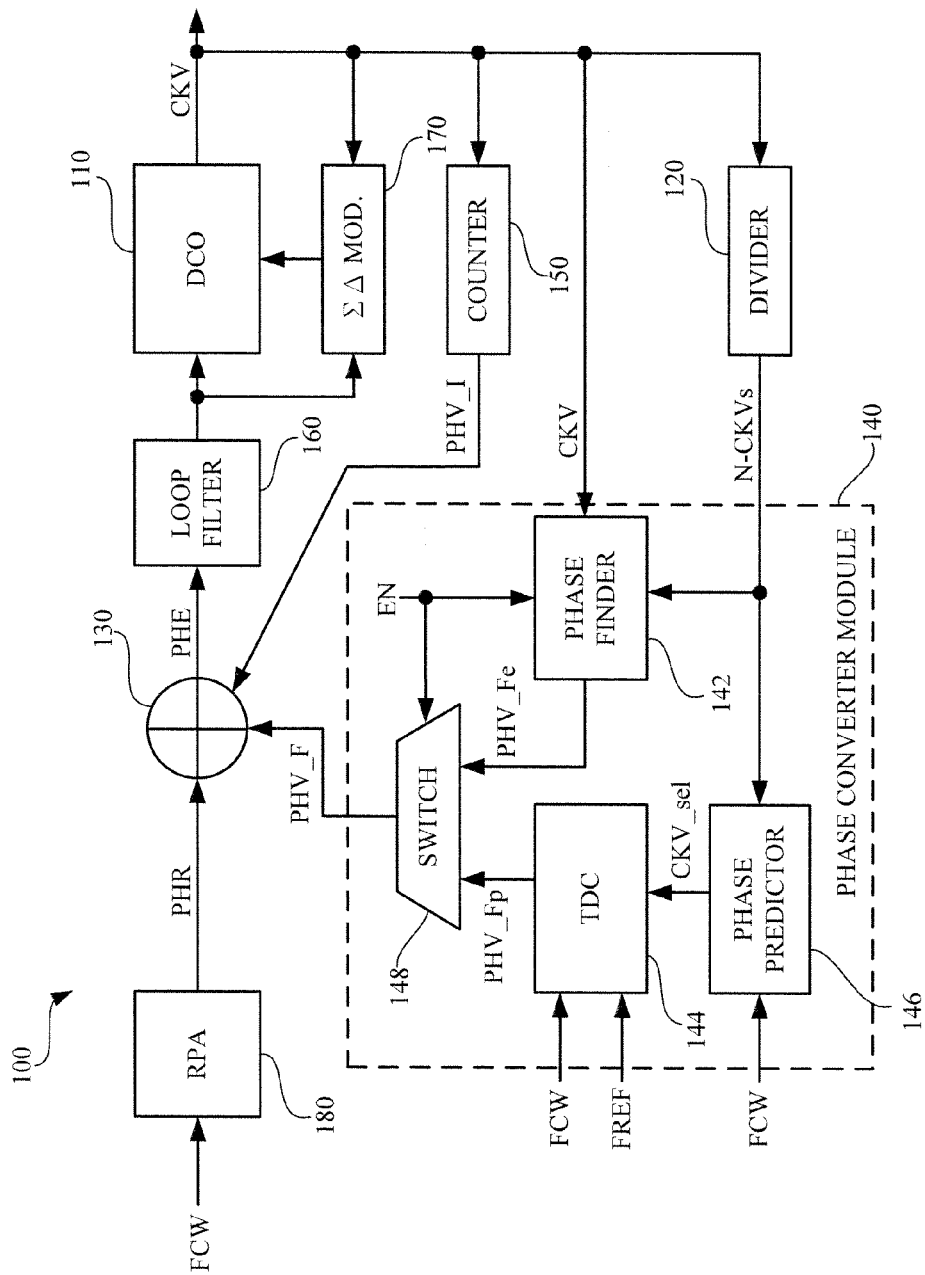
FIG. 1 is a functional block diagram illustrating the phase-locked loop circuit according to embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1. FIG. 1 is a functional block diagram illustrating a phase-locked loop circuit 100 according to some embodiments of the present disclosure. As shown in FIG. 1, the phase-locked loop circuit 100 includes a digitally-controlled oscillator (DCO) 110, a divider 120, a controller 130 and a phase converter module 140. In some embodiments, the phase-locked loop circuit 100 further includes a counter 150, a loop filter 160, a sigma-delta (ΣΔ) modulator 170 and a reference phase accumulator (RPA) 180.

The digitally-controlled oscillator 110 is configured to generate an oscillator output signal CKV, which has an assigned oscillation frequency and an oscillation phase. The oscillation frequency and the oscillation phase of the oscillator output signal CKV is controlled by a DCO control signal PHE generated by the controller 130. In practice, the controller 130 can be a phase detector (PD) in the PLL circuit 100.

In some embodiments, the digitally-controlled oscillator 110 is a numerically controlled oscillator (NCO). Explained in a different way, the digitally-controlled oscillator 110 generates the oscillator output signal CKV at different frequencies according to a reference numerical index. The controller 130 generates the DCO control signal (as the reference numerical index) in accordance with an integral phase part PHV_I and a fractional phase part PHV_F, which are sampled and fed back from the oscillator output signal CKV.

In some embodiments, the counter 150 disposed between the digitally-controlled oscillator 110 and the controller 130 is configured for counting a count value according to the oscillator output signal CKV, and outputting the count value as the integral phase part PHV_I. For illustration, the count value represents how many rising edges of the oscillator output signal CKV is counted in a predetermined time period. If the count value is lower than the reference numerical index, it means that the frequency of the oscillator output signal CKV is too low, and then the controller 130 needs to raise the frequency of the digitally-controlled oscillator 110 accordingly. For example, the count value that is equal to 2 is smaller than the reference numerical index that is equal to 3.2. In this case, the integral phase part PHV_I (i.e., the count value) generated by the counter 130 determines the oscillation frequency of the oscillator output signal CKV.

On the other hand, the fractional phase part PHV_F substantially determines the phase of the oscillator output signal CKV. In some embodiments, the fractional phase part PHV_F is generated by the phase converter module 140 according to the oscillator output signal CKV and N-phased oscillator output signals N-CKVs.

Figure 2:
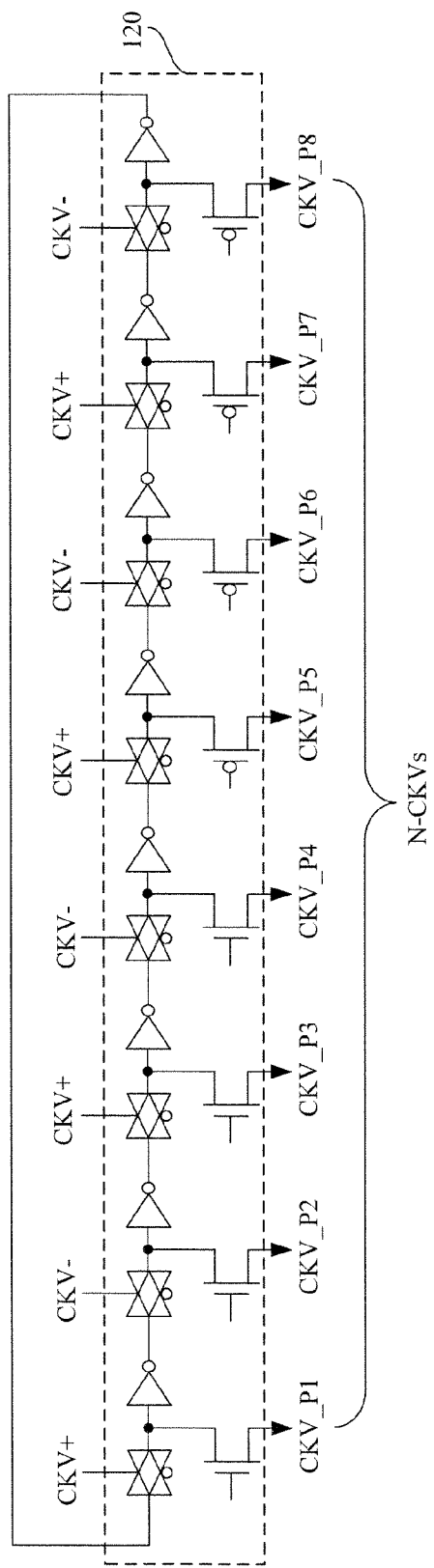
FIG. 2 is a schematic diagram illustrating the divider in FIG. 1 according to embodiments of this disclosure.

In some embodiments, the oscillator output signal CKV is converted by the divider 120 into N-phased oscillator output signals N-CKVs. Reference is also made to FIG. 2, which is a schematic diagram illustrating the divider 120 in FIG. 1 according to embodiments of this disclosure. As shown in FIG. 1 and FIG. 2, the divider 120 is connected to the digitally-controlled oscillator 110 and receives two opposite phases of the oscillator output signal CKV (including a positive output signal CKV+ and a negative output signal CKV−). For illustration in FIG. 2, the oscillator output signal CKV is converted into 8-phased oscillator output signals by the divider 120. In some embodiments, the divider 120 is a divider by 4. In such case, the positive output signal CKV+ and the negative output signal CKV− are processed by the divider by 4 and converted into the 8-phased oscillator output signals (the phase signals CKV_P1, CKV_P2, CKV_P3 ..., CKV_P8). However, the disclosure is not limited to this. In some other embodiments, the N-phased oscillator output signals are 4-phased (converted by a divider by 2), 6-phased (converted by a divider by 3), 10-phased (converted by a divider by 5), or any equivalent phased oscillator output signals.

For illustration, the 8-phased oscillator output signals, which include the phase signals CKV_P1, CKV_P2, CKV_P3 ..., CKV_P8, are separated by an equal phase angle. For example, the first phase signal CKV_P1 and the second phase signal CKV_P2 are separated by π/4 (2π/8) in-between; the second phase signal CKV_P2 and the third phase signal CKV_P3 are also separated by π/4 in-between, and so on. In some other embodiments, the oscillator output signal CKV is divided into N phases, each as phase signals CKV_P1, CKV_P2, CKV_P3 ..., CKV_Pn.

Figure 3A:
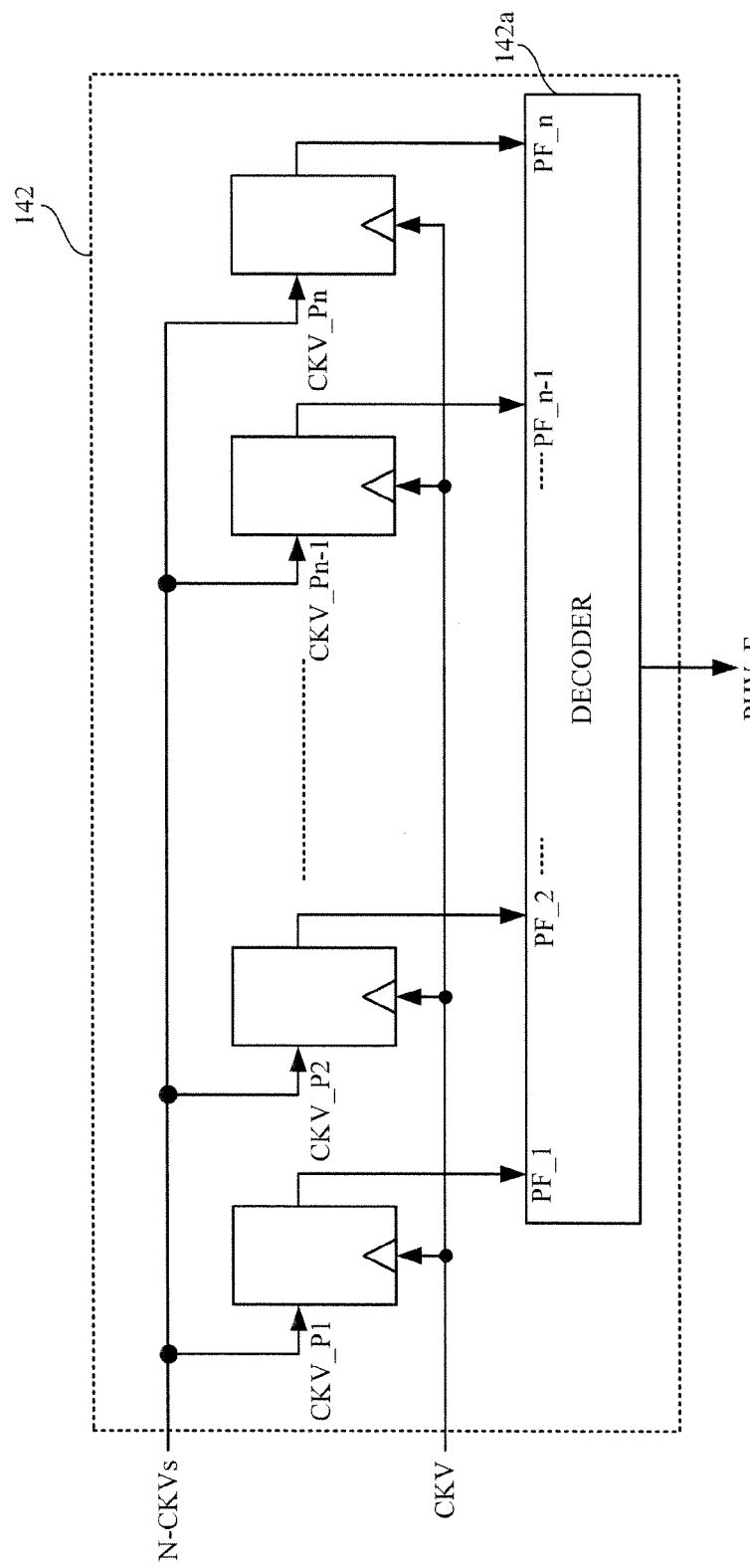
FIG. 3A is a schematic diagram illustrating the phase finder according to embodiments of the disclosure.
Figures 5A, 5B:
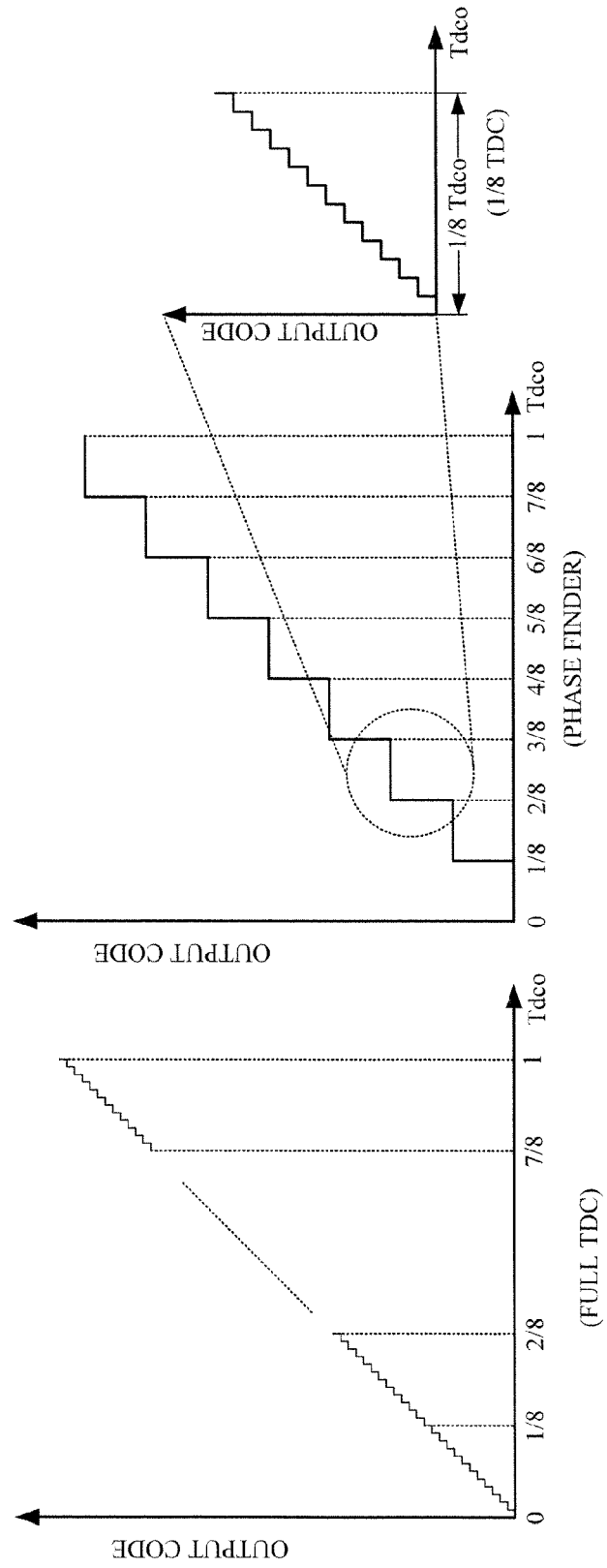
FIG. 5A and FIG. 5B are schematic diagrams illustrating comparison between a conventional TDC and two-steps for calculating the fractional phase part of this disclosure.

The phase converter module 140 includes a phase finder 142 and a time-to-digital converter (TDC) 144. In some embodiments, the phase finder 142 is a fast phase finder for calculating an estimated value PHV_Fe of the fractional phase part PHV_F. Reference is also made to FIG. 3A, FIG. 3B and FIG. 5B. FIG. 3A is a schematic diagram illustrating the phase finder 142 according to some embodiments of present the disclosure. FIG. 3B is a schematic diagram illustrating an operation of the phase finder 142 according to some embodiments of the present disclosure.

As shown in FIG. 5B, one oscillation period Tdco (reciprocal of the oscillation frequency) of the digitally-controlled oscillator 110 is divided into 8 sub-periods corresponding to the 8-phased oscillator output signals (i.e., N=8 in embodiments shown in FIG. 5B). The phase finder 142 detects which sub-period of the eight sub-periods (0 to ⅛ Tdco, ⅛ to 2/8 Tdco, 2/8 to 3/8 Tdco ..., 7/8 to 1 Tdco) does the oscillator output signal CKV match. In some embodiments, the phase finder 142 generates an output code according to which sub-period of the eight sub-periods is matched with the oscillator output signal CKV. The number of sub-periods shown in FIG. 5B is given for illustrative purposes. Various numbers of sub-periods are within the contemplated scope of the present disclosure.

As shown in FIG. 3A, the phase finder 142 includes eight stages of logic circuits. These eight stages of the logic circuits are connected in parallel with each other. Each stage receives one of the N-phased oscillator output signals N-CKVs and the oscillator output signal CKV. Each stage of logic circuits in the phase finder 142 compares one phase from the N-phased oscillator output signals (the phase signals CKV_P1, CKV_P2, ..., CKV_Pn−1 CKV_Pn) with the oscillator output signal CKV. The outcomes (PF_1, PF_2 ..., PF_n−1, PF_n) of the comparison are gathered and converted by a decoder 142a into the estimated value PHV_Fe of the fractional phase part PHV_F.

In the operational example, shown in FIG. 3B, if the oscillator output signal CKV has a rising edge between the rising edges of the phase signals CKV_P2 and CKV_P3, the outcomes [PF_1, PF_2, PF_3, PF_4, ..., PF_n−1, PF_n] will be [1, 1, 0, 0, ..., 0, 0]. The N-digit outcomes represent the phase of the oscillator output signal CKV is between the phase signals CKV_P2 and CKV_P3. Therefore, the phase finder 142 may figure out the phase signals CKV_P2 and CKV_P3 has phases approximate to the real oscillator output signal CKV.

In this case, the phase finder 142 may select one phase signal CKV_P3 (or it can be CKV_P2) among N-phased oscillator output signals N-CKVs as the approximate phase signal, such to calculate the estimated value PHV_Fe. In this case, after the phase finder 142 is activated and select the approximate phase signal, the phase finder 142 ensures that a phase error between the oscillator output signal CKV and the selected phase signal CKV_P3 will be less than one sub-period (i.e., ⅛ Tdco or 2π/8 when N=8). In other words, the phase finder 142 may roughly calculate the estimated value PHV_Fe by selecting one from N sub-periods (each of them covers ⅛ oscillation period Tdco when N=8).

Afterword, the time-to-digital converter 144 shown in FIG. 1 is configured for sampling the selected phased signal CKV_sel (e.g., the selected phased signal CKV_P3) with a reference-frequency signal FREF to calculate a precise value PHV_Fp of the fractional phase part PHV_F within one sub-period (1/N oscillation period Tdco). The reference-frequency signal FREF represents the assigned frequency to the digitally-controlled oscillator 110.

In some embodiments, the phase finder 142 is activated when the phase error of the oscillator output signal is still larger than one sub-period. After the phase finder 142 figures out the selected phase signal, the phase error is less than one sub-period, and then the phase finder 142 is deactivated and the time-to-digital converter 144 is activated. In some embodiments, the phase converter module 140 further includes a phase predictor 146 and a switch 148.

When the phase finder 142 is activated, the switch 148 of the phase converter module 140 bypasses the estimated value PHV_Fe as the fractional phase part PHV_F. When the phase finder 142 is deactivated and the time-to-digital converter 144 is activated, the switch 148 bypasses the precise value PHV_Fp as the fractional phase part PHV_F.

The phase predictor 146 is configured for selecting one phase signal from the N-phased oscillator output signals N-CKVs according to a frequency command word FCW and providing the selected phase signal CKV_sel to the time-to-digital converter 144. The phase predictor 146 can be initialized by the selected phase signal (e.g., CKV_P3 in aforesaid example) picked by the phase finder 142. After the phase finder 142 is deactivated, the phase predictor 146 is configured for providing a correct selected phase signal CKV_sel for subsequent periods of the oscillator output signal CKV.

Figure 4:
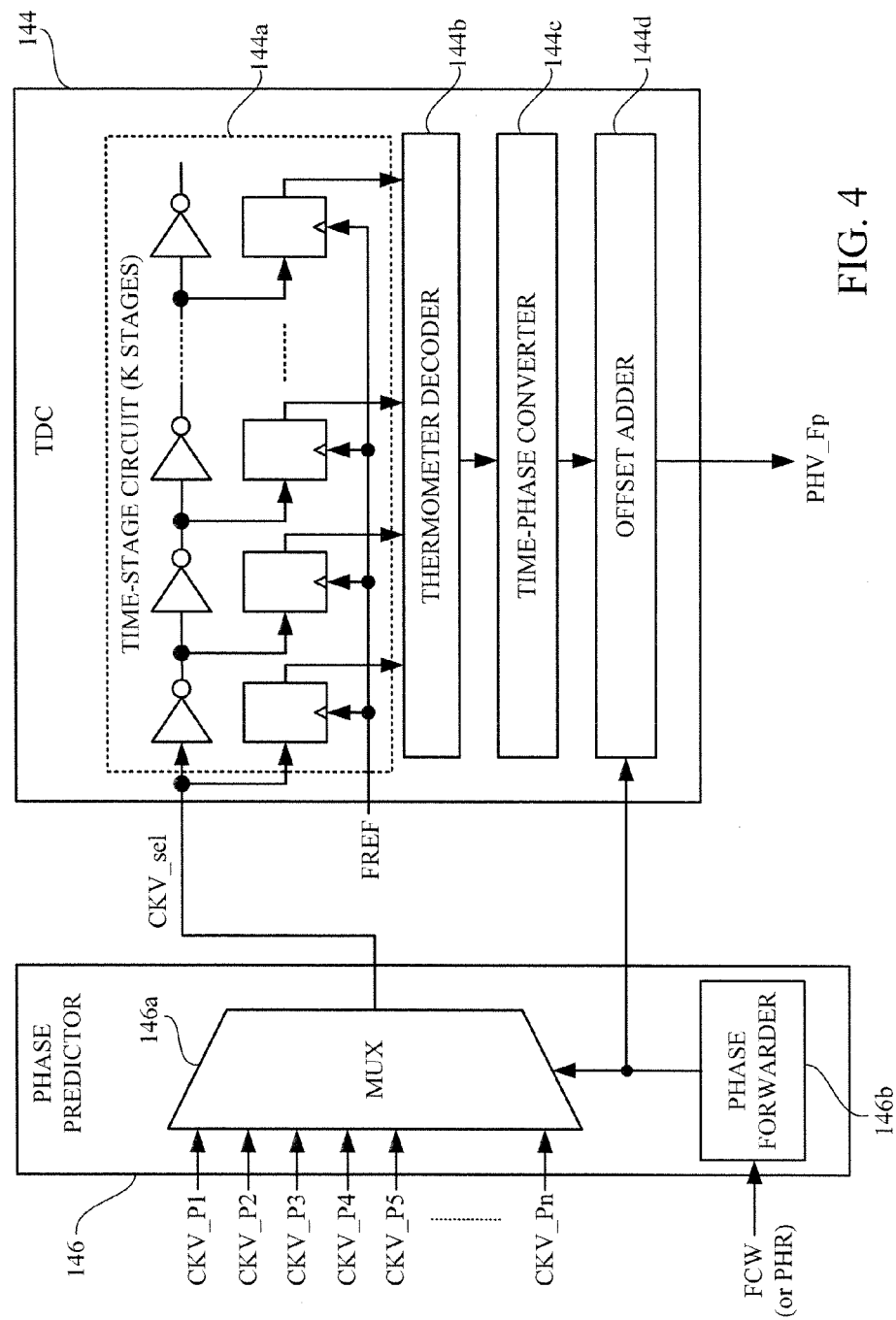
FIG. 4 is a schematic diagram illustrating the time-to-digital converter and the phase predictor according to embodiments of the disclosure.

Reference is also made to FIG. 4. FIG. 4 is a schematic diagram illustrating the time-to-digital converter 144 and the phase predictor 146.

As shown in FIG. 4, the phase predictor 146 may include a multiplexer 146a and a phase forwarder 146b. In some embodiments, the phase forwarder 146b is configured for predicting which sub-period will the next oscillator output signal match according to the frequency command word FCW. For illustration, the frequency command word represents the reference numerical index. For example, when the reference numerical index is equal to 3.2, the next period of the oscillator output signal shall be 3.2*2=6.4; and, the second next period shall be 3.2*3=9.6, etc. In some embodiments, the phase forwarder 146b predicts which sub-period will the next oscillator output signal match, and such that the multiplexer 146a chooses the corresponding selected phase signal CKV_sel from the N-phased oscillator output signals N-CKVs (e.g., CKV_P1~CKV_Pn) according to the prediction of the phase forwarder 146b. In some other embodiments, the phase forwarder 146b predicts the sub-period according to a reference phase signal PHR, which is converted from the frequency command word FCW by the reference phase accumulator (RPA) 180.

As shown in FIG. 4, the time-to-digital converter 144 shown in FIG. 4 includes a time-stage circuit 144a, a thermometer decoder 144b, a time-phase converter 144c and an offset adder 144d. Reference is also made to FIG. 5A and FIG. 5B. FIG. 5A and FIG. 5B are schematic diagrams illustrating comparison between a conventional TDC and two-steps (by the phase finder 142 and the time-to-digital converter 144) for calculating the fractional phase part PHV_F of this disclosure.

In some approaches illustrated in FIG. 5A, a TDC must cover one full period of the oscillation period Tdco. In order to achieve a resolution of 96 stages, the TDC must be capable of sampling the phase of the oscillator output signal CKV into 96 tiny phase-periods and outputs 96 different output codes according to the sampling outcome. The TDC requires 96-stage logic circuits for sampling the oscillator output signal. Therefore, the TDC covering full period of the oscillation period Tdco must be operated at a relative high frequency and have a relative complex circuit structure.

Compared to the approaches illustrated in FIG. 5A, for illustration in FIG. 5B, the phase finder 142 (referring to FIG. 1 and FIG. 3) in embodiments of this disclosure roughly find out the approximate phase region (one selected from the eight phases) of the oscillator output signal CKV. The time-to-digital converter 144 in this disclosure is only required to 1/N period of the oscillation period Tdco, instead of covering the full period of the oscillation period Tdco.

To be noticed that, the time-stage circuit 144a shown in FIG. 4 include K stages of logic circuits for sampling the selected phased signal CKV_sel (e.g., the selected phased signal CKV_P3) with the reference-frequency signal FREF to calculate the precise value PHV_Fp of the fractional phase part PHV_F within one sub-period (⅛ oscillation period Tdco in embodiments of N=8). For example, the time-stage circuit may only include 12 stages of logic circuits (K=12), such that the resolution provide by the phase converter module 140 (shared by the phase finder 142 and the time-to-digital converter 144) is equivalent to 8 (phases)*12 (stages)=96. In aforesaid embodiments, the N is taken as 8 for demonstration, and the K is taken as 12 for demonstration, however the disclosure is not limited thereto. In some other embodiments, to achieve different resolutions of phase-locked operation, the phase finder 142 may divide the one oscillation period of the digitally-controlled oscillator is divided into N sub-periods and the time-stage circuit 144a may include K stages of logic circuits, wherein N*K≥the required resolution, and N and K are positive integers.

Based on aforesaid embodiments, the phase converter module 140 includes the fast N-phased phase finder 142 and the precise time-to-digital converter 144 covering only 1/N oscillation period Tdco. The phase converter module 140 may find out the phase of the oscillator output signal CKV effectively with a high resolution, and does not require a complex logic circuits (with lots of stages) for sampling the oscillator output signal CKV.

As shown in FIG. 1, the phase-locked loop circuit 100 also includes the loop filter 160, the sigma-delta (ΣΔ) modulator 170 and the reference phase accumulator 180. The loop filter 160 is disposed between the digitally-controlled oscillator 110 and the controller 130. The sigma-delta (ΣΔ) modulator 170 is configured for synchronizing the phases between the output signal (i.e., the oscillator output signal CKV) and the input signal of the digitally-controlled oscillator 110. The reference phase accumulator (RPA) 180 is configured for receiving the frequency command word (FCW) and accordingly generating a reference phase signal PHR to the controller. The operations of the loop filter 160, the sigma-delta (ΣΔ) modulator 170 and the reference phase accumulator 180 are known by a person in the art, and not to be mentioned here.

Figure 6:
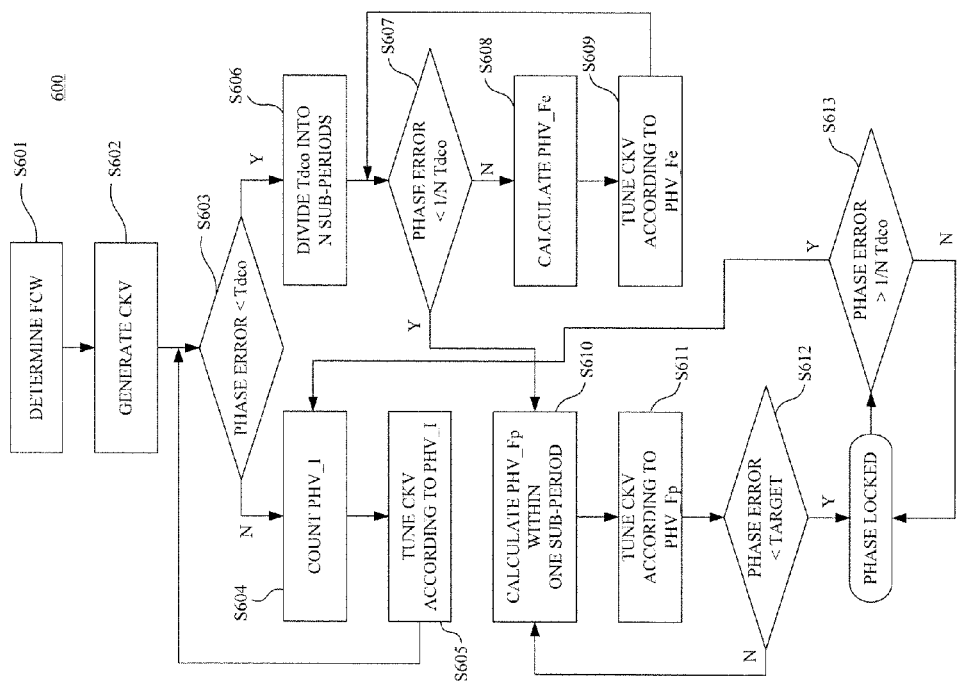
FIG. 6 is a schematic diagram illustrating a phase-locked controlling method according to embodiments of the disclosure.

Reference is made to FIG. 6, which is a schematic diagram illustrating a phase-locked controlling method 600 according to embodiments of the disclosure. The phase-locked controlling method 600 is described below with reference to the phase-locked loop circuit 100 of the embodiments shown in FIG. 1 to FIG. 4.

As shown in FIG. 6, the phase-locked controlling method 600 executes step S601 for determining a frequency control word (referring to FCW in FIG. 1) for setting an oscillation frequency of an oscillator output signal (referring to CKV in FIG. 1). Step S602 is executed for generating the oscillator output signal CKV. Then, a phase error of the oscillator output signal CKV is detected, and step S603 is executed for determining if the phase error of the oscillator output signal is less the one oscillation period (referring to Tdco in FIG. 5B) of the oscillator output signal CKV. If the phase error is larger than one oscillation period Tdco of the oscillator output signal CKV, step S604 is executed for activating a counter (referring to 150 in FIG. 1) for counting an integral phase part (referring to PHV_I in FIG. 1) according to the oscillator output signal CKV. Then, step S605 is executed for tuning the oscillator output signal CKV according to the integral phase part PHV_I.

If the phase error of the oscillator output signal CKV is less the one oscillation period Tdco, step S606 is executed for dividing one oscillation period of the digitally-controlled oscillator into N sub-periods.

Step S607 is executed for determining if the phase error of the oscillator output signal is less the 1/N oscillation period (i.e., 1/N Tdco=one sub-period).

If the phase error is less than one oscillation period of the oscillator output signal and larger than 1/N oscillation period, a phase finder (referring to 142 in FIG. 1 and FIG. 3A) is activated, and step S608 is executed for detecting which sub-period does the oscillator output signal match and calculating an estimated value (referring to PHV_Fe in FIG. 1 and FIG. 3A) of a fractional phase part (referring to PHV_F in FIG. 1). Step S609 is executed for tuning the oscillator output signal according to the estimated value of the fractional phase part.

If the phase error is less than 1/N oscillation period (i.e., 1/N Tdco=one sub-period), the phase finder is deactivated and a time-to-digital converter (referring to 144 in FIG. 1 and FIG. 4) is activated, and step S610 is executed for calculating a precise value (referring to PHV_Fp in FIG. 1 and FIG. 4) of the fractional phase part PHV_F within one sub-period. Step S611 is executed for tuning the oscillator output signal CKV according to the precise value PHV_Fp of the fractional phase part PHV_F.

Step S612 is executed for determining if the phase error of the oscillator output signal is less than a target error. If the phase error is less than the target error, the phase is settled and the phase-locked loop circuit 100 may lock the frequency and the phase of the oscillator output signal CKV.

As shown in FIG. 6, after step S612, the phase error of the oscillator output signal CKV is limited below the target error by the phase-locked loop circuit 100, such that the phase of the oscillator output signal CKV is locked. However, during the operation of the oscillator over time, there are some probabilities that the phase of the oscillator output signal CKV may be shifted away from the ideal locked phase. Therefore, after the phase is locked, step S613 is executed periodically (e.g., every 100 microseconds, every 10 seconds, etc.) to check whether the phase error is larger than 1/N oscillation period (i.e., 1/N Tdco).

If the phase error is larger than 1/N oscillation period, the method 600 has to repeat the phase-locking procedure again from step S604 to S612. The procedure starts from re-counting the integral phase part (referring to PHV_I in FIG. 1) by the counter 150 in steps S604~S605. Then, the procedure goes to re-counting fractional phase part PHV_F by the phase converter module 140 in steps S606~S612. In this case, the counter 150 must be activated again for re-locking the phase, or the counter 150 must remains active all the time since the phase-locked loop circuit 100 is initialized. Therefore, the counter 150 will cause extra power consumption.

Figure 7:
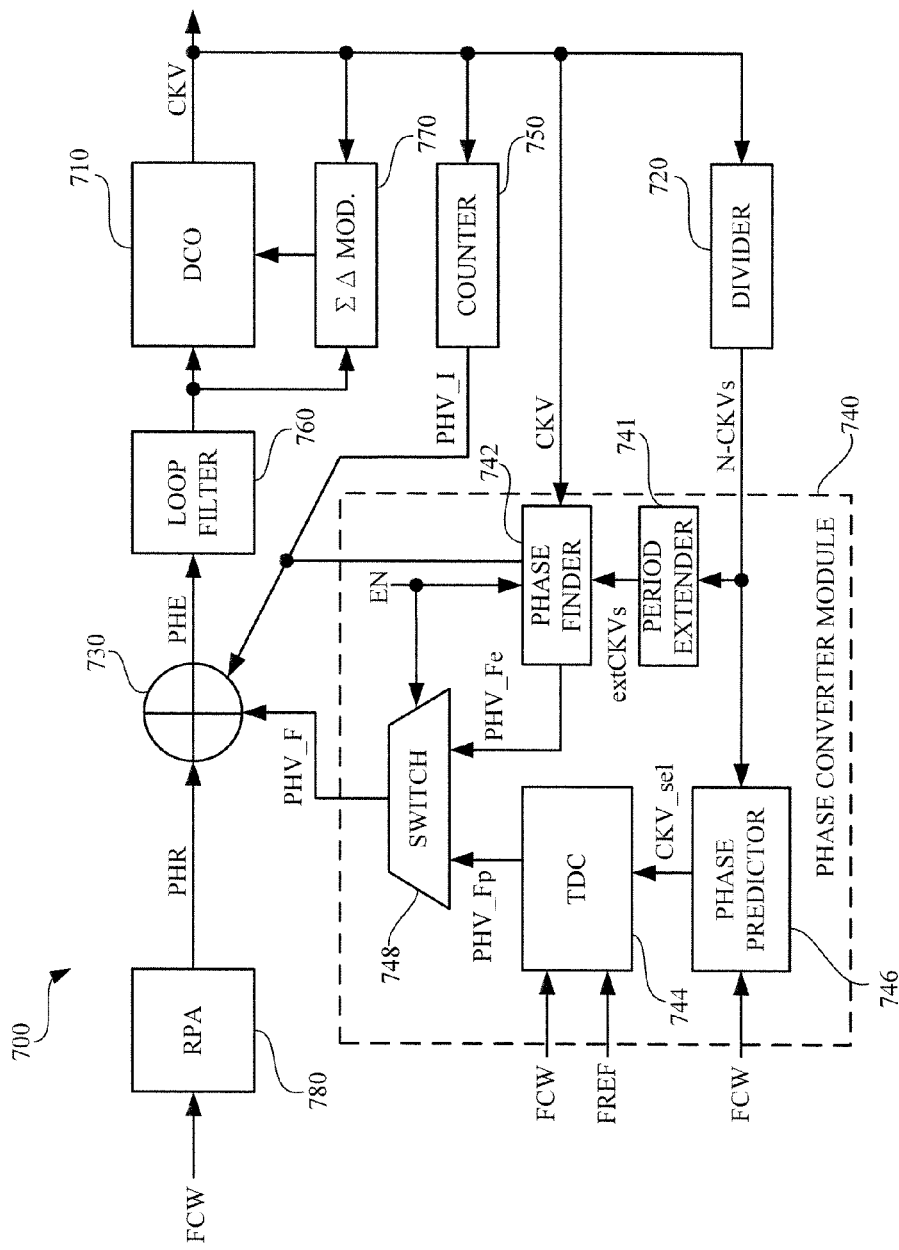
FIG. 7 is a functional block diagram illustrating the phase-locked loop circuit according to embodiments of the disclosure.

Reference is made to FIG. 7, which is a functional block diagram illustrating the phase-locked loop circuit 700 according to embodiments of the disclosure. As shown in FIG. 7, the phase-locked loop circuit 700 includes a digitally-controlled oscillator (DCO) 710, a divider 720, a controller 730, a phase converter module 740, a counter 750, a loop filter 760, a sigma-delta (ΣΔ) modulator 770 and a reference phase accumulator (RPA) 780. In comparison to the phase-locked loop circuit 100 shown in FIG. 1, the phase converter module 740 of the phase-locked loop circuit 700 further includes a period extender 741. The period extender 741 is disposed between the divider 720 and the phase finder 742. The period extender 741 is configured for extending the N-phased oscillator output signals N-CKVs (generated by the divider 720 from the oscillator output signal CKV) into M*N-phased oscillator output signals extCKVs. The M*N-phased oscillator output signals extCKVs corresponds to M oscillation period of the digitally-controlled oscillator. M and N are positive integers. In this embodiment, an example with M=2 and N=8 is disclosed for demonstration. Therefore, the 8-phased oscillator output signals N-CKVs are extended by the period extender 741 into the 16-phased oscillator output signals extCKVs in this embodiment, but the disclosure is not limited to this configuration. For example, in some other embodiment, M and N can be other positive integers.

Reference is also made to FIG. 8 and FIG. 9, FIG. 8 is a schematic diagram illustrating the 8-phased oscillator output signals N-CKVs according to the embodiment, and FIG. 9 is a schematic diagram illustrating the extended 16-phased oscillator output signals extCKVs generated by the period extender 741 according to the embodiment. As shown in FIG. 8, the 8-phased oscillator output signals N-CKVs correspond to one oscillation period (1*Tdco) of the digitally-controlled oscillator 710. One oscillation period Tdco is divided into eight sub-periods. Each of the 8-phased oscillator output signals N-CKVs matches one of the eight sub-periods within the oscillation period Tdco. The 8-phased oscillator signals N-CKVs are periodical in every one oscillation period Tdco.

In this embodiment, the period extender 741 can be a divider circuit (e.g., a divider-by-2) to convert the 8-phased oscillator signals N-CKVs into the extended 16-phased oscillator output signals extCKVs shown in FIG. 9. For example, the 1$^{st}$ phased oscillator output signal CKV_P1 in FIG. 8 can be processed by the period extender 741 (e.g., the divider-by-2), and the positive output and the negative output of the divider-by-2 will be the 1$^{st}$ phased oscillator output signal extCKV_P1 and the 9$^{th}$ phased oscillator output signals extCKV_P9 in FIG. 9. The 2$^{nd}$ phased oscillator output signal CKV_P2 in FIG. 8 can be processed by period extender 741 (e.g., the divider-by-2), and the positive output and the negative output of the divider-by-2 will be the 2$^{nd}$ phased oscillator output signal extCKV_P2 and the 10$^{th}$ phased oscillator output signals extCKV_P10 in FIG. 9. Similarly, the 3$^{rd}$ to the 8$^{th}$ phased oscillator output signals CKV_P3~CKV_P8 in FIG. 8 can be extended to be the extended phased oscillator output signals extCKV_P3~extCKV_P8 and extCKV_P11~extCKV_P16 in FIG. 9.

The 16-phased oscillator signals extCKVs are periodical in every two oscillation period 2*Tdco. The disclosure is not limited to this. In other embodiments, the period extender 741 can be the divider-by-M, such as to form the M*N-phased oscillator output signals extCKVs.

In aforesaid embodiment shown in FIG. 1, the counter 150 is utilized to count the integral phase part (referring to PHV_I in FIG. 1) when the phase error is larger than one oscillation period (1*Tdco), and a comparison window of the phase converter module 140 is one oscillation period (1*Tdco). In other words, the phase converter module 140 is suitable for the phase error is less than or equal to 1*Tdco. Once the phase is shifted or out-of-locked, the counter 150 must be utilized to re-calculate the integral phase part PHV_I.

In current embodiment shown in FIG. 7, the counter 750 is only utilized to count the integral phase part (referring to PHV_I in FIG. 1) when the phase-locked loop circuit 700 is initialized (i.e., the first time that the phase-locked loop circuit 700 is activated to perform the phase-locking operation) and the phase error is larger than one oscillation period (1*Tdco).

Figure 10:
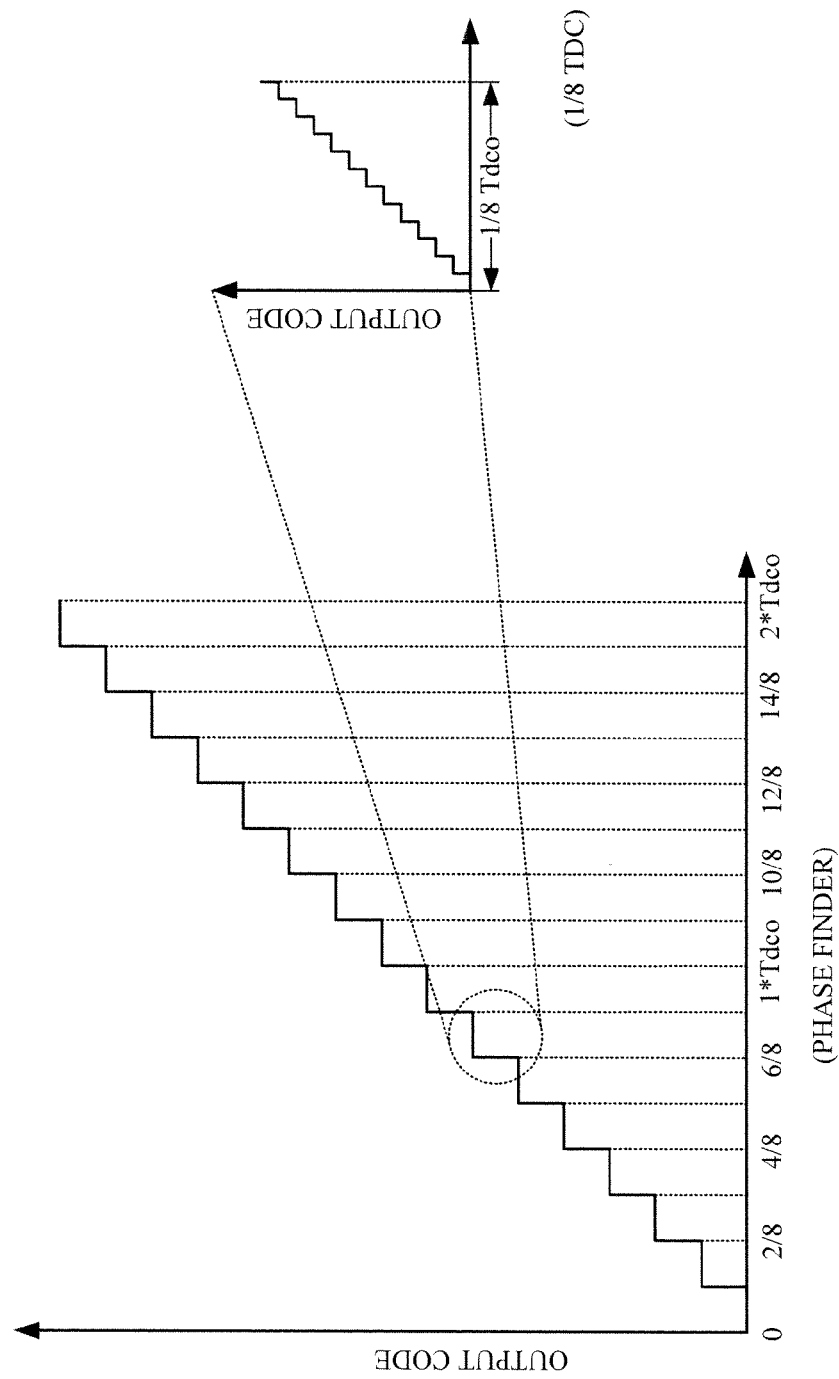
FIG. 10 is a schematic diagram illustrating two-steps for calculating the fractional phase part of this disclosure.

After the first time that the phase is locked, the counter 750 is turned off in this embodiment. Reference is also made to FIG. 10, which is a schematic diagram illustrating two-steps (by the phase finder 742 and the time-to-digital converter 744) for calculating the fractional phase part PHV_F of this disclosure. As shown in FIG. 8, FIG. 9 and FIG. 10, the phase finder 742 in this embodiment includes M*N stages of logic circuits connected in parallel (similarly to the embodiment shown in FIG. 3A), and each stage of the logic circuits configured for sampling the oscillator output signal CKV with one of the M*N-phased oscillator output signals extCKVs for calculating an estimated value of the fractional phase part PHV_Fe. In this embodiment, the M*N-phased oscillator output signals extCKVs are 16-phased oscillator output signals extCKVs corresponding to two oscillation period (2*Tdco), as shown in FIG. 9, such that a comparison window of the phase finder 742 is two oscillation period (2*Tdco), as shown in FIG. 10. In other words, the phase finder 742 is able to handle the phase error less than or equal to 2*Tdco.

Therefore, when the phase is shifted or out-of-locked, the phase-locked loop circuit 700 can re-locate the correct integral phase part PHV_I with the phase converter module 740, because the comparison window is now 2*Tdco, not only 1*Tdco. Therefore, the phase-locked loop circuit 700 can tolerate a larger gap of transient phase error (up to 2*Tdco in this embodiment). In this embodiment, the counter 750 is not necessary to re-calculate the integral phase part PHV_I, and the counter 750 is turned off after the first time that the phase is locked.

Other detail structures and behavior of the phase-locked loop circuit 700 are similar to the phase-locked loop circuit 100 in aforesaid embodiments, and not to be repeated again.

Figure 11:
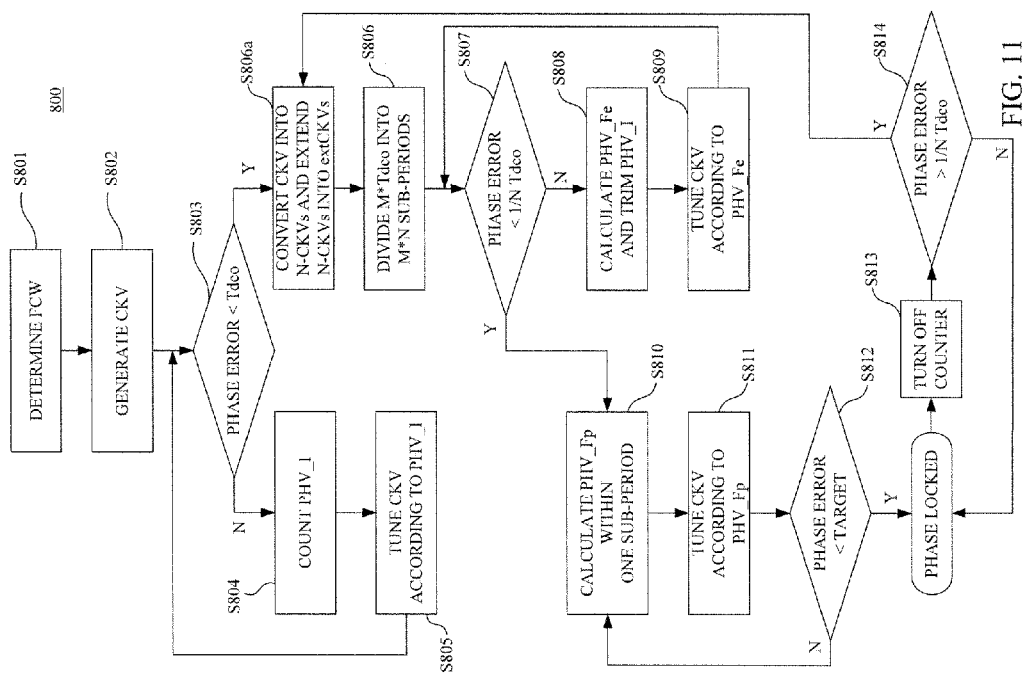
FIG. 11 is a schematic diagram illustrating a phase-locked controlling method according to embodiments of the disclosure.

Reference is made to FIG. 11, which is a schematic diagram illustrating a phase-locked controlling method 800 according to embodiments of the disclosure.

As shown in FIG. 11, before the step S806, the phase-locked controlling method 800 further executes step S806a, to convert the oscillator output signal CKV into N-phased oscillator output signals N-CKVs, and also extend the N-phased oscillator output signals N-CKVs into M*N- phased oscillator output signals extCKVs corresponding to M oscillation period of the digitally-controlled oscillator 710.

Step S806 is executed for dividing the M oscillation periods of the digitally-controlled oscillator into M*N sub-periods. Steps S808 is performed to calculate the estimated value PHV_Fe according to the M*N-phased oscillator output signals extCKVs.

After the first time that phase is locked, the phase-locked controlling method 800 executes step S813 to turn off the counter 750. Afterward, step S814 is executed periodically (e.g., every 100 microseconds, every 10 seconds, etc.) to check whether the phase error is larger than 1/N oscillation period (i.e., 1/N Tdco). If the phase error is larger than 1/N oscillation period, the phase-locked controlling method 800 returns to step S806, so as to re-calculate the estimated value PHV_Fe and trimming the integral phase part PHV_I by the phase finder 742 in step S808 (but not re-calculating the integral phase part PHV_I by the counter 750).

In some embodiments, a phase-locked loop circuit is disclosed that includes a digitally-controlled oscillator (DCO), a controller, a divider, and a time-to-digital converter (TDC) module. The digitally-controlled oscillator (DCO) is configured for generating an oscillator output signal having an oscillation frequency. The controller is configured for generating a DCO control signal for setting the oscillation frequency in accordance with an integral phase part and a fractional phase part of the oscillator output signal. The divider is configured for converting the oscillator output signal into N-phased oscillator output signals. The time-to-digital converter (TDC) module is configured for determining the fractional phase part according to the oscillator output signal and the N-phased oscillator output signals. The phase converter module includes a period extender, a phase finder and a time-to-digital converter. The period extender is configured for extending the N-phased oscillator output signals into M*N-phased oscillator output signals corresponding to M oscillation period of the digitally-controlled oscillator. The phase finder is configured for sampling the oscillator output signal with the M*N-phased oscillator output signals to calculate an estimated value of the fractional phase part. The M oscillation period of the digitally-controlled oscillator is divided into M*N sub-periods. The phase finder detects which sub-period of the M*N sub-periods the oscillator output signal matches. The time-to-digital converter is configured for sampling one of the N-phased oscillator output signals with a reference-frequency signal to calculate a precise value of the fractional phase part within one sub-period.

Also disclosed is a phase converter circuit, suitable for a phase-locked loop circuit including a digitally-controlled oscillator (DCO) for generating an oscillator output signal and a divider for converting the oscillator output signal into N-phased oscillator output signals. The phase converter circuit includes a period extender, a phase finder and a time-to-digital converter. The period extender is configured for extending the N-phased oscillator output signals into M*N-phased oscillator output signals corresponding to M oscillation period of the digitally-controlled oscillator. The phase finder is configured for sampling the oscillator output signal with the M*N-phased oscillator output signals to calculate an estimated value of the fractional phase part. The M oscillation period of the digitally-controlled oscillator is divided into M*N sub-periods. The phase finder detects which sub-period of the M*N sub-periods the oscillator output signal matches. The time-to-digital converter is configured for sampling one of the N-phased oscillator output signals with a reference-frequency signal to calculate a precise value of the fractional phase part within one sub-period.

A phase-locked controlling method, suitable for a phase-locked loop circuit, is also disclosed that includes the steps outlined below. A frequency control word for setting an oscillation frequency of an oscillator output signal is determined. The oscillator output signal is generated. The oscillator output signal is converted into N-phased oscillator output signals corresponding to one oscillation period of the digitally-controlled oscillator. The N-phased oscillator output signals is extended into M*N-phased oscillator output signals corresponding to M oscillation period of the digitally-controlled oscillator. The M oscillation periods of the digitally-controlled oscillator are divided into M*N sub-periods. A phase error of the oscillator output signal is detected. If the phase error is less than one oscillation period of the oscillator output signal and larger than 1/N oscillation period, which sub-period matches the oscillator output signal is detected and an estimated value of a fractional phase part is calculated. If the phase error is less than 1/N oscillation period, a precise value of the fractional phase part within one sub-period is calculated. The oscillator output signal is tuned according to the fractional phase part.

The foregoing outlines several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a digitally-controlled oscillator (DCO) configured for generating an oscillator output signal;
    a controller configured for setting an oscillation frequency of the oscillator output signal in accordance with a fractional phase part;
    a divider configured for converting the oscillator output signal into N-phased oscillator output signals corresponding to one oscillation period of the digitally-controlled oscillator; and
    a phase converter module, comprising:
        a period extender, configured for extending the N-phased oscillator output signals into M*N-phased oscillator output signals corresponding to M oscillation period of the digitally-controlled oscillator;
        a phase finder comprising M*N stages of logic circuits connected in parallel, each stage of the logic circuits configured for sampling the oscillator output signal with one of the M*N-phased oscillator output signals for calculating an estimated value of the fractional phase part; and
        a time-to-digital converter configured for sampling one of the N-phased oscillator output signals with a reference-frequency signal to calculate a precise value of the fractional phase part.

2. The circuit of claim 1, wherein the M oscillation period of the digitally-controlled oscillator is divided into M*N sub-periods, the phase finder detects which sub-period the oscillator output signal match, and the time-to-digital converter calculate the precise value of the fractional phase part within one sub-period.

3. The circuit of claim 2, wherein the phase finder is activated when a phase error of the oscillator output signal is larger than one sub-period, and the phase finder is deactivated and the time-to-digital converter is activated when a phase error of the oscillator output signal is less than one sub-period.

4. The circuit of claim 2, wherein the phase converter module further comprises a phase predictor configured for selecting one phase signal from the N-phased oscillator output signals according to a frequency command word (FCW) and providing the selected phase signal to the time-to-digital converter.

5. The circuit of claim 4, wherein the phase predictor comprises:
a phase forwarder configured for predicting which sub-period will the next oscillator output signal match according to the frequency command word (FCW); and
a multiplexer configured for selecting the phase signal from the N-phased oscillator output signals according to the prediction of the phase forwarder.

6. The circuit of claim 1, further comprising:
a counter configured for counting a count value according to the oscillator output signal, and outputting the count value as an integral phase part, wherein the controller is configured to generate a DCO control signal for setting the oscillation frequency in accordance with the integral phase part and the fractional phase part of the oscillator output signal.

7. The circuit of claim 6, wherein the counter is activated to generate the integral phase part when the circuit is initialized and a phase error of the oscillator output signal is larger than one oscillation period of the digitally-controlled oscillator.

8. The circuit of claim 7, wherein the counter is deactivated when the phase error of the oscillator output signal is less than one oscillation period of the digitally-controlled oscillator.

9. The circuit of claim 1, further comprising:
a loop filter disposed between the digitally-controlled oscillator and the controller;
a sigma-delta modulator connected with the loop filter and the digitally-controlled oscillator, configured for synchronizing the digitally-controlled oscillator; and
a reference phase accumulator (RPA) configured for receiving a frequency command word (FCW) and accordingly generating a reference phase signal to the controller.

10. The circuit of claim 1, wherein the circuit is an all-digital phase-locked loop (ADPLL).

11. A circuit, comprising:
a period extender configured for extending an oscillator output signal with N-phased oscillator output signals into M*N-phased oscillator output signals corresponding to M oscillation period of a digitally-controlled oscillator, wherein the oscillator output signal is generated by the digitally-controlled oscillator (DCO), the N-phased oscillator output signals are converted from the oscillator output signal by a divider;
a phase finder configured for sampling the M*N-phased oscillator output signals to calculate an estimated value of a fractional phase part utilized for controlling an oscillation frequency of the oscillator output signal, the M oscillation periods of the digitally-controlled oscillator being divided into M*N sub-periods, the phase finder detecting which sub-period the oscillator output signal match; and
a time-to-digital converter configured for one of the N-phased oscillator output signals with a reference-frequency signal to calculate a precise value of the fractional phase part within one sub-period.

12. The circuit of claim 11, wherein the phase finder is activated when a phase error of the oscillator output signal is larger than one sub-period.

13. The circuit of claim 11, wherein the phase finder is deactivated and the time-to-digital converter is activated when a phase error of the oscillator output signal is less than one sub-period.

14. The circuit of claim 11, further comprising a phase predictor configured for selecting one phase signal from the N-phased oscillator output signals according to a frequency command word (FCW), and providing the selected phase signal to the time-to-digital converter.

15. The circuit of claim 14, wherein the phase predictor comprises:
a phase forwarder configured for predicting which sub-period will the next oscillator output signal match according to the frequency command word (FCW); and
a multiplexer configured for selecting the phase signal from the N-phased oscillator output signals according to the prediction of the phase forwarder.

16. A method, comprising:
determining a frequency control word for setting an oscillation frequency of an oscillator output signal;
generating the oscillator output signal by a digitally-controlled oscillator;
converting the oscillator output signal into N-phased oscillator output signals corresponding to one oscillation period of the digitally-controlled oscillator;
extending the N-phased oscillator output signals into M*N-phased oscillator output signals corresponding to M oscillation period of the digitally-controlled oscillator;
dividing the M oscillation periods of the digitally-controlled oscillator into M*N sub-periods;
detecting a phase error of the oscillator output signal;
if the phase error is less than one oscillation period of the oscillator output signal and larger than 1/N oscillation period, detecting which sub-period the oscillator output signal matches and calculating an estimated value of a fractional phase part;
if the phase error is less than 1/N oscillation period, calculating a precise value of the fractional phase part within one sub-period; and
tuning the oscillator output signal according to the fractional phase part.

17. The method of claim 16, further comprising:
when the method is initialized, activating a counter for counting an integral phase part according to the oscillator output signal if the phase error is larger than one oscillation period of the oscillator output signal; and
tuning the oscillator output signal according to the integral phase part.

18. The method of claim 17, further comprising:
after the phase error is locked to be less than 1/N oscillation period, turning off the counter configured for counting the integral phase part; and
estimating the integral phase part according to the M*N-phased oscillator output signals corresponding to the M oscillation period of the digitally-controlled oscillator.

19. The method of claim 17, wherein the estimated value of the fractional phase part is calculated by sampling the oscillator output signal with the N-phased oscillator output signals.

20. The method of claim 19, wherein the precise value of the fractional phase part is calculated by sampling one of the N-phased oscillator output signal with a reference-frequency signal.

* * * * *